(12) United States Patent
Gomm et al.

(10) Patent No.: US 9,154,141 B2
(45) Date of Patent: *Oct. 6, 2015

(54) CONTINUOUS HIGH-FREQUENCY EVENT FILTER

(75) Inventors: Tyler Gomm, Boise, ID (US); Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 343 days.

This patent is subject to a terminal disclaimer.

(21) Appl. No.: 13/294,083

(22) Filed: Nov. 10, 2011

(65) Prior Publication Data

US 2012/0051493 A1    Mar. 1, 2012

Related U.S. Application Data

(63) Continuation of application No. 11/360,093, filed on Feb. 22, 2006, now Pat. No. 8,073,890.

(51) Int. Cl.
| | |
|---|---|
| *H03L 7/08* | (2006.01) |
| *H03L 7/081* | (2006.01) |
| *H03L 7/085* | (2006.01) |
| *H03L 7/089* | (2006.01) |
| *G11C 7/22* | (2006.01) |
| *G06F 7/62* | (2006.01) |

(52) U.S. Cl.
CPC ............... *H03L 7/0814* (2013.01); *G06F 7/62* (2013.01); *G11C 7/22* (2013.01); *G11C 7/222* (2013.01); *H03L 7/085* (2013.01); *H03L 7/0805* (2013.01); *H03L 7/089* (2013.01)

(58) Field of Classification Search
CPC .............................. G06F 17/5045; G06F 17/10
USPC ......................................................... 708/300
See application file for complete search history.

(56) References Cited

U.S. PATENT DOCUMENTS

| | | | | |
|---|---|---|---|---|
| 2,574,283 A | * | 11/1951 | Potter | ........................ 235/132 E |
| 2,754,056 A | * | 7/1956 | Friedman | ......................... 702/78 |
| 3,702,476 A | * | 11/1972 | Nathanson et al. | ........... 342/195 |

(Continued)

FOREIGN PATENT DOCUMENTS

WO    WO 9962176 A1 * 12/1999 ............. H03K 21/40

OTHER PUBLICATIONS

Nir Dahan, "Non-Power-of-2 Gray Counter Design", from Adventures in ASIC Digital Design, Jun. 2008, retrieved from https://asicdigitaldesign.wordpress.com/2008/06/09/non-power-of-2-gray-counter-design.*

(Continued)

*Primary Examiner* — Chuong D Ngo
*Assistant Examiner* — Matthew Sandifer
(74) *Attorney, Agent, or Firm* — Dorsey & Whitney LLP

(57) ABSTRACT

A circuit and method for generating an active output signal in response to detecting N events, which are represented by an event signal. A counter circuit is configured to increment and decrement through a sequence of values in response to the event signal. Detection logic coupled to the counter circuit is configured to detect at least first and second values of the sequence. The detection logic is further configured to generate the active output signal and switch to detecting the second value in response to detecting the first value and generate the active output signal and switch to detecting the first value in response to detecting the second value. The first and second values are separated by N counts.

18 Claims, 8 Drawing Sheets

(56) References Cited

U.S. PATENT DOCUMENTS

| | | | |
|---|---|---|---|
| 4,527,075 | A | 7/1985 | Zbinden |
| 4,780,894 | A | 10/1988 | Watkins et al. |
| 5,012,673 | A * | 5/1991 | Takano et al. ............... 73/114.36 |
| 5,170,416 | A | 12/1992 | Goetz et al. |
| 5,208,833 | A * | 5/1993 | Erhart et al. .................. 375/294 |
| 5,572,158 | A | 11/1996 | Lee et al. |
| 5,614,855 | A | 3/1997 | Lee et al. |
| 5,673,389 | A * | 9/1997 | Weber et al. ..................... 714/55 |
| 5,727,037 | A | 3/1998 | Maneatis |
| 5,757,218 | A | 5/1998 | Blum |
| 5,781,055 | A | 7/1998 | Bhagwan |
| 5,784,627 | A | 7/1998 | Macdonald |
| 5,798,885 | A | 8/1998 | Saiki et al. |
| 5,828,250 | A | 10/1998 | Konno |
| 5,945,857 | A | 8/1999 | Havens |
| 6,040,726 | A | 3/2000 | Martin |
| 6,052,073 | A * | 4/2000 | Carr et al. ...................... 341/100 |
| 6,052,152 | A | 4/2000 | Malcolm, Jr. et al. |
| 6,084,452 | A | 7/2000 | Drost et al. |
| 6,125,157 | A | 9/2000 | Donnelly et al. |
| 6,137,328 | A | 10/2000 | Sung |
| 6,169,434 | B1 | 1/2001 | Portmann |
| 6,181,178 | B1 | 1/2001 | Choi |
| 6,194,916 | B1 | 2/2001 | Nishimura et al. |
| 6,198,326 | B1 | 3/2001 | Choi et al. |
| 6,201,423 | B1 | 3/2001 | Taguchi et al. |
| 6,275,555 | B1 | 8/2001 | Song |
| 6,282,253 | B1 | 8/2001 | Fahrenbruch |
| 6,285,226 | B1 | 9/2001 | Nguyen |
| 6,298,004 | B1 | 10/2001 | Kawasaki et al. |
| 6,310,653 | B1 | 10/2001 | Malcolm, Jr. et al. |
| 6,320,438 | B1 | 11/2001 | Arcus |
| 6,342,801 | B1 | 1/2002 | Shin |
| 6,384,652 | B1 | 5/2002 | Shu |
| 6,426,660 | B1 | 7/2002 | Ho et al. |
| 6,433,597 | B2 | 8/2002 | Jung |
| 6,441,659 | B1 | 8/2002 | Demone |
| 6,445,228 | B1 | 9/2002 | Nguyen |
| 6,452,432 | B2 | 9/2002 | Kim |
| 6,459,314 | B2 | 10/2002 | Kim |
| 6,466,071 | B2 | 10/2002 | Kim et al. |
| 6,496,045 | B1 | 12/2002 | Nguyen |
| 6,498,524 | B1 | 12/2002 | Kawasaki et al. |
| 6,507,220 | B1 | 1/2003 | Groen et al. |
| 6,535,040 | B2 | 3/2003 | Jung et al. |
| 6,539,072 | B1 | 3/2003 | Donnelly et al. |
| 6,542,015 | B2 | 4/2003 | Zhou et al. |
| 6,556,489 | B2 | 4/2003 | Gomm et al. |
| 6,566,918 | B1 * | 5/2003 | Nguyen ........................ 327/115 |
| 6,578,154 | B1 | 6/2003 | Wynen et al. |
| 6,580,305 | B1 | 6/2003 | Liu et al. |
| 6,583,657 | B1 | 6/2003 | Eckhardt et al. |
| 6,603,337 | B2 | 8/2003 | Cho |
| 6,605,969 | B2 | 8/2003 | Mikhalev et al. |
| 6,625,765 | B1 | 9/2003 | Krishnan |
| 6,628,276 | B1 | 9/2003 | Elliott |
| 6,643,790 | B1 | 11/2003 | Yu et al. |
| 6,677,792 | B2 | 1/2004 | Kwak |
| 6,690,218 | B2 | 2/2004 | Goldblatt |
| 6,711,226 | B1 | 3/2004 | Williams et al. |
| 6,737,927 | B2 | 5/2004 | Hsieh |
| 6,744,289 | B2 | 6/2004 | Nguyen et al. |
| 6,750,688 | B2 | 6/2004 | Takai |
| 6,765,421 | B2 | 7/2004 | Brox et al. |
| 6,765,976 | B1 | 7/2004 | Oh |
| 6,768,697 | B2 | 7/2004 | Labrum et al. |
| 6,788,120 | B1 | 9/2004 | Nguyen |
| 6,794,913 | B1 | 9/2004 | Stengel |
| 6,801,067 | B2 | 10/2004 | Jang |
| 6,801,072 | B2 | 10/2004 | Guinea et al. |
| 6,819,155 | B1 | 11/2004 | Ling et al. |
| 6,853,225 | B2 | 2/2005 | Lee |
| 6,859,107 | B1 | 2/2005 | Moon et al. |
| 6,873,199 | B2 | 3/2005 | Nishimura et al. |
| 6,876,240 | B2 | 4/2005 | Moon et al. |
| 6,879,923 | B2 | 4/2005 | Butler |
| 6,882,196 | B2 | 4/2005 | Yee et al. |
| 6,917,230 | B2 | 7/2005 | Miller |
| 6,920,081 | B2 | 7/2005 | Labrum et al. |
| 6,924,684 | B1 | 8/2005 | Nguyen |
| 6,927,642 | B2 | 8/2005 | Hsieh |
| 6,934,215 | B2 | 8/2005 | Chung et al. |
| 6,940,328 | B2 | 9/2005 | Lin |
| 6,958,639 | B2 | 10/2005 | Park et al. |
| 6,963,235 | B2 | 11/2005 | Lee |
| 6,982,581 | B2 | 1/2006 | Dosho et al. |
| 7,005,900 | B1 | 2/2006 | Nguyen |
| 7,005,904 | B2 | 2/2006 | Minzoni |
| 7,015,739 | B2 | 3/2006 | Lee et al. |
| 7,019,574 | B2 | 3/2006 | Schrödinger |
| 7,020,228 | B2 | 3/2006 | Miyano |
| 7,039,147 | B2 | 5/2006 | Donnelly et al. |
| 7,046,059 | B2 | 5/2006 | Kwak |
| 7,075,856 | B2 | 7/2006 | Labrum et al. |
| 7,078,949 | B2 | 7/2006 | Kim et al. |
| 7,098,714 | B2 | 8/2006 | Lin |
| 7,116,141 | B2 | 10/2006 | Demone |
| 7,116,143 | B2 | 10/2006 | Deivasigamani et al. |
| 7,116,149 | B2 | 10/2006 | Kim |
| 7,119,594 | B2 | 10/2006 | Kim |
| 7,120,839 | B2 | 10/2006 | Fayneh et al. |
| 7,227,809 | B2 | 6/2007 | Kwak |
| 7,403,056 | B2 * | 7/2008 | Qu et al. ........................ 327/269 |
| 7,423,465 | B2 | 9/2008 | Gomm |
| 7,791,388 | B2 | 9/2010 | Gomm |
| 8,666,013 | B1 * | 3/2014 | Khor et al. .................... 375/376 |
| 2001/0010670 | A1 * | 8/2001 | Jinbo et al. .................. 369/47.28 |
| 2001/0013989 | A1 | 8/2001 | Saiki et al. |
| 2003/0080791 | A1 | 5/2003 | Fiscus |
| 2004/0113667 | A1 | 6/2004 | Jin |
| 2005/0028019 | A1 | 2/2005 | Kim |
| 2005/0262373 | A1 | 11/2005 | Kim |
| 2005/0270893 | A1 | 12/2005 | Lin et al. |
| 2006/0044931 | A1 | 3/2006 | Kim |
| 2006/0045227 | A1 | 3/2006 | Guan |
| 2006/0103440 | A1 | 5/2006 | Easwaran |
| 2007/0194821 | A1 | 8/2007 | Gomm et al. |
| 2008/0116948 | A1 * | 5/2008 | Qu et al. ........................ 327/158 |
| 2008/0315930 | A1 | 12/2008 | Gomm |

OTHER PUBLICATIONS

Clive Maxfield, "How to generate Gray Codes for nonpower-of-2 sequences", from EE Times, Jun. 2007, retrieved from http://www.eetimes.com/document.asp?doc_id=1274581.*

* cited by examiner

CONTINUOUS HIGH-FREQUENCY EVENT FILTER

CROSS REFERENCE TO RELATED APPLICATION

This application is a continuation of U.S. patent application Ser. No. 11/360,093, filed Feb. 22, 2006, U.S. Pat. No. 8,073,890, which application is incorporated herein by reference, in its entirety, for any purpose.

TECHNICAL FIELD

The present invention relates generally to integrated circuits, and more specifically, to circuits and methods for tracking the occurrences of events and generating in response thereto an active output signal indicating the occurrence of n-events.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations.

Internal circuitry in the memory device generates an internal clock signal that is synchronized with the external clock signal and is used to synchronize internal and external operations. To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed.

The delay-locked loop 100 further includes a phase detector 110 that receives the CLKFB and CLKBUF signals and generates a delay control signal SL/SR having a value indicating the phase difference between the CLKBUF and CLKFB signals. A delay controller 112 generates the DADJ signal in response to the SL/SR signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals.

In operation, the phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKSYNC signal corresponds to the internal clock signal.

FIG. 2 illustrates the phase detector 110. The phase detector 110 includes a phase detection (PD) window 156 that provides an initial delay of tPDW to the CLKFB signal 134 to generate a delayed feedback clock signal CLKFB2D 157 at an output. Another delay element 158 provides a tPDW/2 delay half of the delay provided by the coarse PD window 156) to CLKBUF 130 to generate a delayed reference clock signal CLKBUFD 159 at an output. The CLKBUFD signal 159 clocks D flip-flops 160, 162 to sample the CLKFB signal 134 and the CLKFB2D signal 157. The output signals PH1 164 and PH2 165 of the D flip-flops 162 and 160, respectively, represent the value of their respective D inputs (CLKFB 134 or CLKFB2D 157) sampled at the rising edge of CLKBUFD 159. The values of the PH1 and PH2 signals represent the phase of the CLKFB signal 134 relative to the CLKREF signal 130. The phase relationship between the PH1 signal 164 and the PH2 signal 165 determines whether to shift the CLKBUF signal 130 earlier or later in time relative to the CLKFB signal 134.

A majority filter 166 receives the PH1 and PH2 signals 164, 165 and a counting clock signal CCLK (not shown) as inputs. The CCLK signal may be the same as the system clock or the CLKBUF signal 130. The majority filter 166 generates an appropriate SL/SR signal as the output 153 of the phase detector 150. As known in the art, the majority filter 166 may include a binary up/down counter clocked by the CCLK signal, which is incremented or decremented in accordance with the levels of the PH1, PH2 signals 164, 165. Alternatively, the majority filter 166 includes a bi-directional shift register that is clocked by the CCLK signal, the direction of the shifting in accordance with the PH1, PH2 signals 164, 165. The majority filter 166 is typically used as a lowpass event filter by counting a certain number of input clock pulses of the CCLK signal (i.e., events) in the same direction (incrementing or decrementing the counter in accordance with the PH1, PH2 signals) before generating an SL or SR signal as an output. For example, the majority filter 166 may always count two clock cycles (events) of the CCLK signal incrementing or decrementing the counter before generating an SL or SR signal as an output. In this manner, clock jitter due to minor fluctuations in operating conditions can be avoided since not every change in the levels of the PH1, PH2 signals will immediately cause an adjustment to be made to the variable delay line 102.

A potential problem with using a binary up/down counter or a bi-directional shift register is that these circuits are reset upon reaching the count value that causes the output of an output signal. For example, in the case a bi-directional shift register is used, an initial condition is usually set from which the bit is shifted in response to the PH1 and PH2 signals. Assuming that two shifts (i.e., two cycles of the CCLK signal) in one direction are required before generating an output signal, when the second shift in the same direction occurs and the output signal is generated, the bi-directional shift register needs to be reset to the initial condition before it can resume shifting in accordance with the PH1, PH2 signals. Resetting the initial condition for the shift register requires a finite time and consumes power. Where the reset time is less than the period of the CCLK signal, all clock cycles can be registered by the shift register. However, where the period of the CCLK signal is less than the reset time, any clock cycles of the CCLK signal that occur during the reset time will not be registered by the shift register, thereby introducing inaccuracies to the delay adjustment.

The same issue arises for a binary up/down counter where the count begins at an initial value, which is then incremented or decremented in response to the CCLK signal and in accordance with the PH1, PH2 signals. Upon reaching the count value to generate an output signal, the counter is reset to the initial count value. As with the use of a bi-directional shift register, the reset operation requires a finite time to complete. During this time, any cycles of the CCLK signal will not result in incrementing or decrementing the count, which results in missing counts. As higher frequency clock signals are utilized for the CCLK signal, more missing counts or lost shifts will occur.

Therefore, there is a need for a event filter that accurately track the occurrence of high frequency events.

SUMMARY OF THE INVENTION

In one aspect of the invention, an event filter having a Gray code counter and detection logic is provided. The Gray code counter is configured to increment and decrement through a Gray code sequence in response to the occurrence of an event. The Gray code sequence has a plurality of count values. The detection logic is coupled to the Gray code counter and configured to detect a first one of the count values of the Gray code sequence, and in response to detecting the first count value, configured to generate an active output signal and further configured switch detection to a second one of the count values of the Gray code sequence.

In another aspect of the invention, a circuit for generating an active output signal in response to detecting N events, which are represented by an event signal, is provided. The circuit includes a counter circuit configured to increment and decrement through a sequence of values in response to the event signal. Detection logic coupled to the counter circuit is configured to detect at least first and second values of the sequence. The detection logic is further configured to generate the active output signal and switch to detecting the second value in response to detecting the first value and generate the active output signal and switch to detecting the first value in response to detecting the second value. The first and second values are separated by N counts.

Another aspect of the invention provides a method for generating an active output signal in response to detecting N events. The method includes incrementing and decrementing through a sequence of count values in response to the occurrence of events. An active output signal is generated in response to detecting a first count value of the sequence. Detecting the first count value is switched to detecting a second count value of the sequence and incrementing and decrementing through the sequence in response to the occurrence of the events is then continued.

Another aspect of the invention provides a method of tracking the occurrence of events. The method includes incrementing and decrementing a count sequence in response to the occurrence of events and generating a detect signal in response to detecting a first count of the count sequence. The method further includes switching from detecting the first count value to detecting a second count value and generating the detect signal in response to detecting the second count value.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 2:
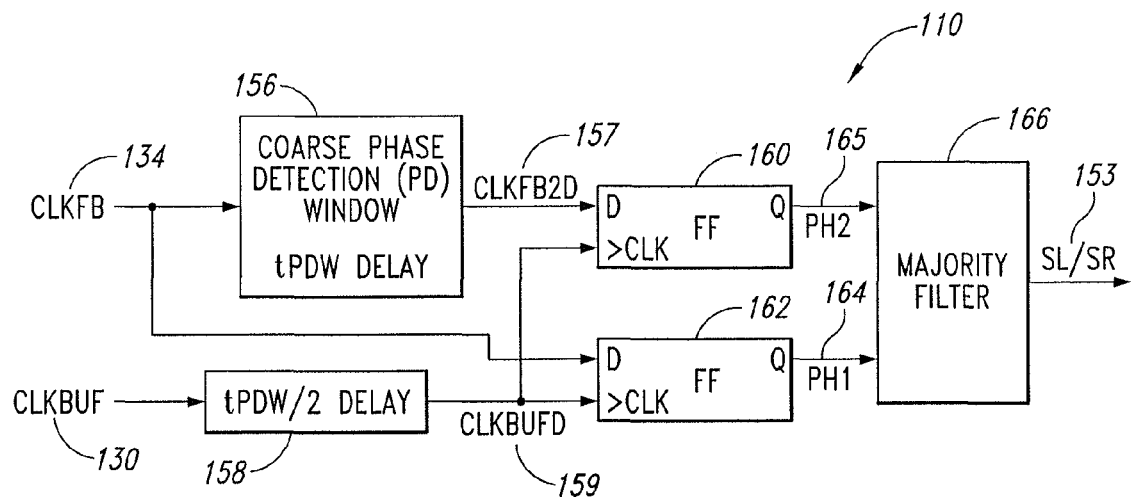
FIG. 2 is a block diagram of a conventional phase detector of the DLL of FIG. 1.
Figure 3:
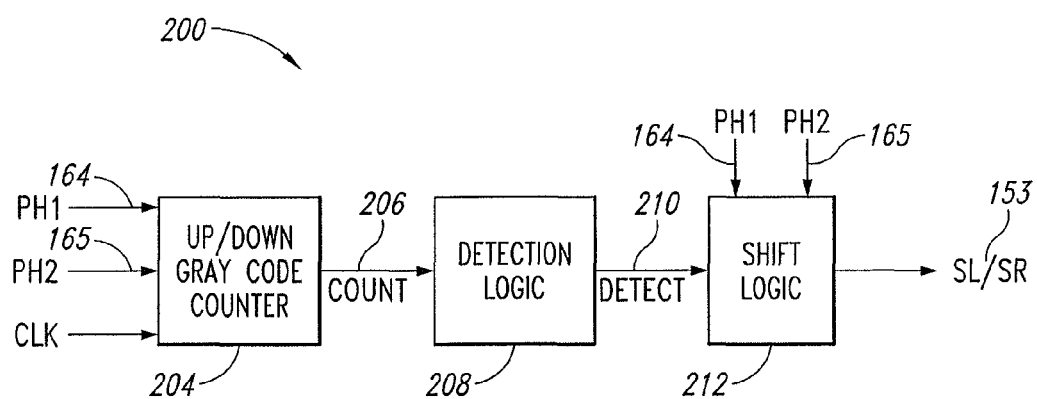
FIG. 3 is a block diagram of an event filter according to an embodiment of the present invention.

FIG. 3 illustrates an event filter 200 according to an embodiment of the present invention. The event filter 200 can be substituted for the majority filter 166 previously discussed with reference to FIG. 2. The PH1 and PH2 signals 164, 165 output from the D flip-flops 62, 60 are provided to a up/down counter 204. The counter 204 is clocked by a clock signal CLK. In the present embodiment, the counter 204 is a Gray code counter. As known in the art, a Gray code is not an arithmetic code, that is, there are no specific weights assigned to the bit positions. A characteristic of a Gray code is that only a single bit changes from one code number to the next. For example, an increasing sequence of a two-bit Gray code starting from 00 is 01, 11, 10 before returning to 00. A decreasing sequence of the two-bit Gray code starting from 00 is simply the reverse of the increasing sequence. In contrast, the increasing sequence of a two-bit binary number starting from 00 is 01, 10, 11 and back to 00. In the case of the two-bit binary number sequence, two bits are changed when incrementing from "01" (1 decimal) to "10" (2 decimal). However, as previously illustrated, with a Gray code only one bit changes as the sequence is incremented, and also as the sequence is decremented. The counter 204 will be described as a two-bit counter. However, as will be described in more detail below, Gray code counters having fewer or greater bits can be used as well. Additionally, counters other than Gray code counters can be used as well.

Each of the PH1 and PH2 signals 164, 165 is used to set the counter 204 to either increment or decrement through a Gray code in response to the CLK signal. In the present example, an active PH1 signal 164 will set the counter 204 to increment in response to the CLK signal, and conversely, an active PH2 signal 165 will set the counter 204 to decrement through the Gray code sequence. The Gray code sequence is output by the counter 204 as a two-bit COUNT value 206 that is provided to detection logic 208. The detection logic 208 generates an active DETECT signal 210 in response to the COUNT value 206 reaching a particular count value. As will be explained in more detail below, when an active DETECT signal 210 is generated, the detection logic 208 switches from detecting a first count value to detecting a second count value. Upon the next active DETECT signal 210, the detection logic 208 switches back to detecting the first count value. That is, assuming a first count value of "00" and a second count value of "11," when the detection logic 208 is set to detect a COUNT value of 11, upon detecting 11, the detection logic 208 switches to detect a COUNT value of 00. When a COUNT value of 00 is eventually detected, then the detection logic 208 switches back to detect a COUNT value of 11 again.

Figure 1:
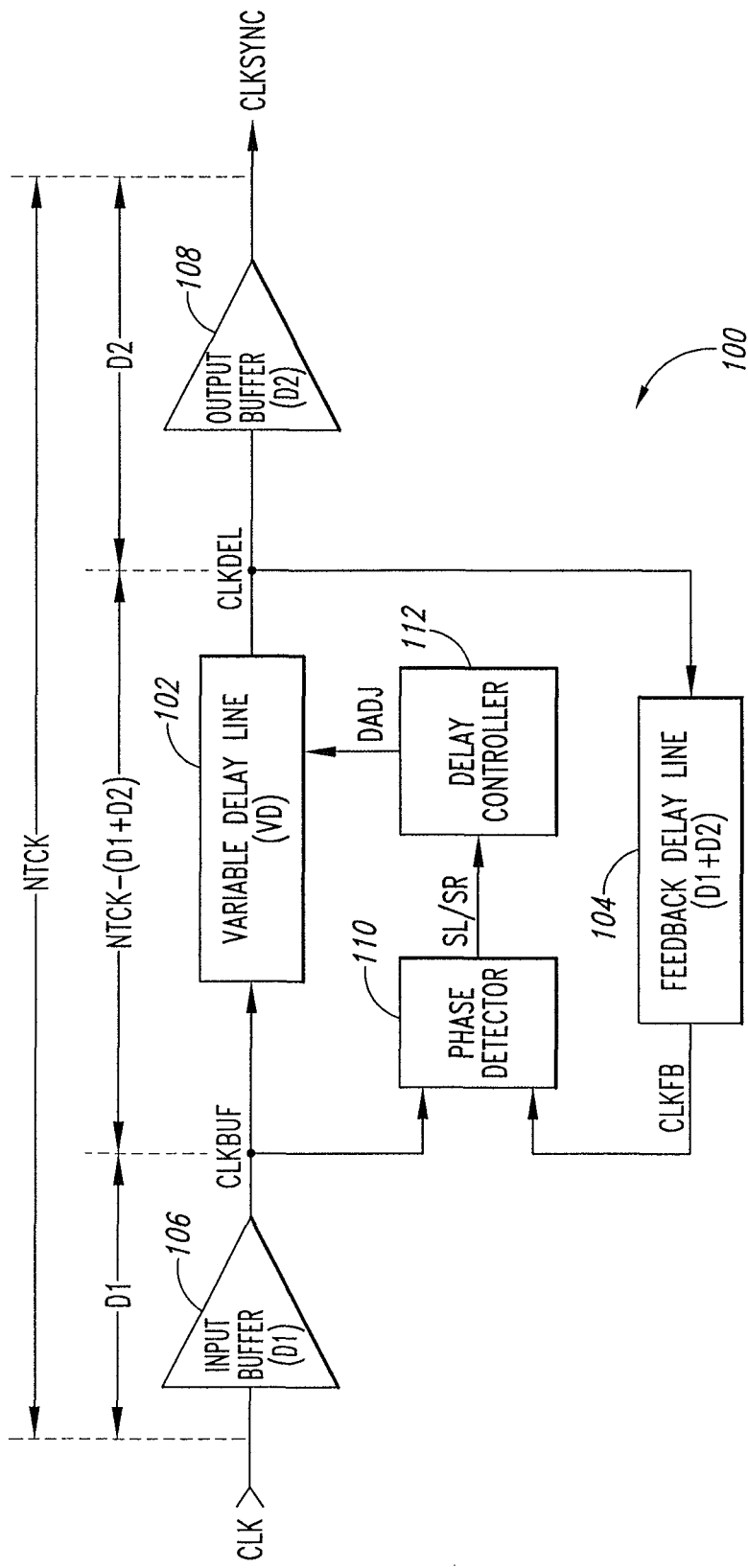
FIG. 1 is a block diagram of a conventional delay-locked loop (DLL).

Shift logic 212 is coupled to receive the DETECT signal 210 and generates either an active SL signal or an active SR signal based on the PH1 and PH2 signals 164, 165. As previously discussed with respect to the phase detector 150 (FIG. 2), the SL/SR signals are provided to the delay controller 112 (FIG. 1), which in turn generates a DADJ signal to adjust the delay of the variable delay line 102.

In contrast to the conventional majority filter 166 (FIG. 2) where a conventional binary counter circuit or shift register circuit is used, the event filter 200 utilizes the counter 204 to count a number of active PH1 CLK events (i.e., the PH1 signal is active when the CLK signal clocks the counter 204) and active PH2 CLK events (i.e., the PH2 signal is active when the CLK signal clocks the counter 204). In the present example, the combination of the two-bit Gray code counter 204 and the detection logic 208 can be used to provide an active DETECT signal 210 when the appropriate number of active PH1 CLK events or PH2 CLK events. As will be explained in more detail below, a benefit to using the Gray code counter 208 is that it is not necessary to reset the count when reaching the count at which an active DETECT signal is generated. As previously discussed with respect to the conventional majority filter 166, active PH1 and PH2 CLK events may occur during the time a conventional binary counter or shift register is reset, causing counts to be missed or shifts to be lost.

Figure 4:
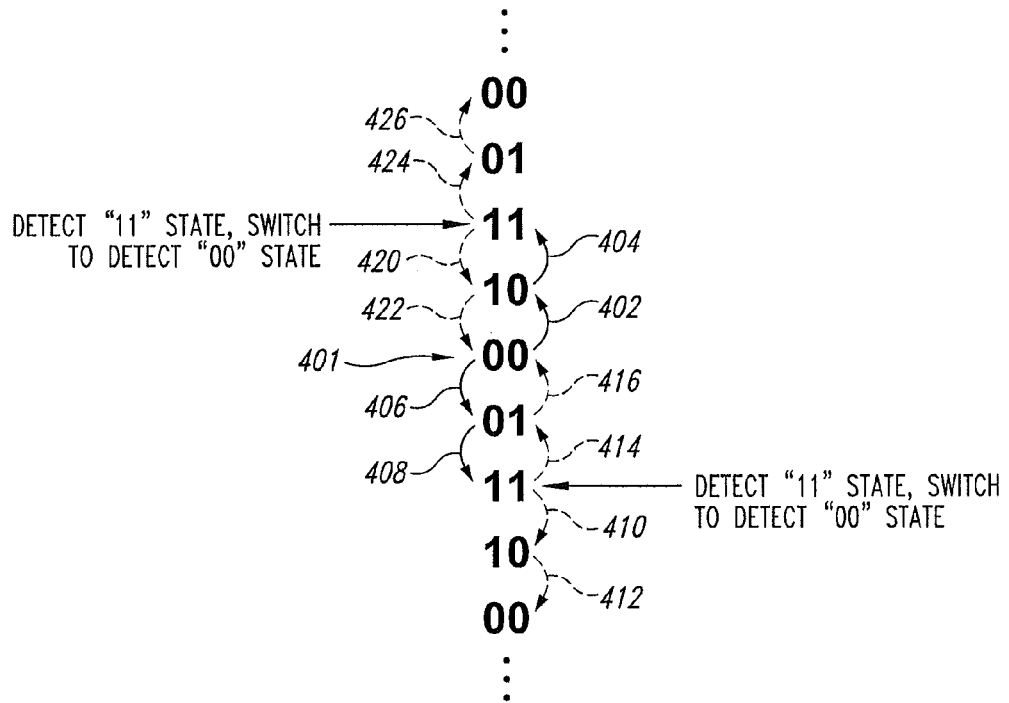
FIG. 4 is a diagram illustrating operation of the event filter of FIG. 3.

Operation of the counter 204 and the detection logic 208 will be described with reference to FIG. 4. Assuming that the count of the counter 204 is at a count value of 00 (at count 401), the detection logic 208 is set to detect a 11 state. As shown in FIG. 4, the 11 state occurs if the counter 204 is incremented or decremented twice consecutively. For example, if the 00 count is incremented twice (represented in FIG. 4 by arrows 402, 404) the COUNT value of the counter 204 is 11. In response to the COUNT value being 11, the detection logic 208 generates an active DETECT signal 210. Additionally, the detection logic 208 is then set to detect the next occurrence of a 00 count.

Rather than resetting the COUNT value of the Gray code to 00, the counter 204 continues to increment and decrement the COUNT value in response to the CLK signal and the PH1, PH2 signals. As shown in FIG. 4, from a value of 11, a 00 count will occur if the counter 204 is incremented or decremented twice consecutively, which is represented by arrows 420, 422 (decremented twice) and by arrows 424, 426 (incremented twice). With the detection logic now set to detect a 00 count, the conditions under which an active DETECT signal 210 will be generated is the same as for the previously described case where the current count is 00 and the detection logic 208 is set to detect a 11 count, that is, two counts away.

As with a convention counter of shift register, the PH1, PH2 CLK events are tracked so that an active DETECT signal is generated at the appropriate time. For example, assuming that the counter 204 has a count of 00, alternating between incrementing and decrementing the count (such as a case represented by arrow 402 followed by arrow 422) does not result in the generation of an active DETECT signal 210. It may be the case that three consecutive counts may be required to reach a count value that causes the detection logic 208 to generate an active DETECT signal. Such a case can exist when a count in one direction occurs. Three counts in the opposite direction are now necessary to reach a count value that the detection logic 208 is set to detect.

As illustrated by the example of FIG. 4, resetting the counter 204 upon generating an active DETECT signal is not required. Consequently, missing any PH1, PH2 CLK events during a reset operation is avoided. As previously discussed, the counter 204 continues to count in response to the CLK signal and the PH1, PH2 signals. Although the reset time is avoided, in order to avoid missing any PH1, PH2 CLK events, the detection logic 208 should be switched from detecting one count value to detecting the other count value within the time it takes for the number of PH1, PH2 CLK events to consecutively occur before an active DETECT signal should be generated. For example, in the present example where a two-bit Gray code counter is used, the detection logic 208 should be switched from detecting a 00 state to detecting a 11 state (or vice-versa) within the time for two consecutive PH1, PH2 CLK events to OCCULT.

Figure 5:
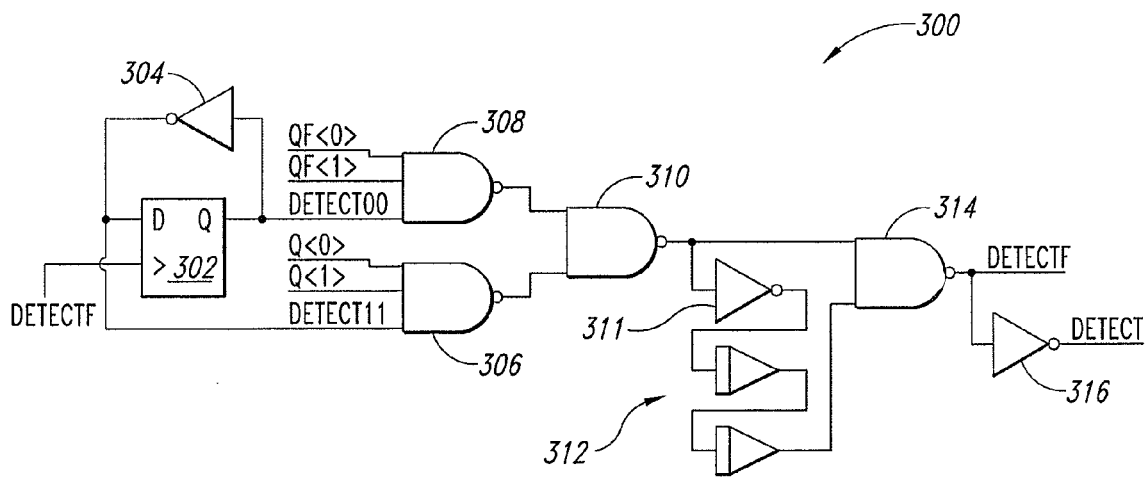
FIG. 5 is a schematic diagram of the detection logic for the event filter of FIG. 3.

FIG. 5 illustrates detection logic 300 according to an embodiment of the present invention. The detection logic 300 can be used with a two-bit Gray code for generating a DETECT signal and can be substituted for the detection logic 208 (FIG. 3). The detection logic 300 includes a D flip-flop 302 having an output and input coupled through a feedback inverter 304. The D flip-flop 302 is clocked by a signal DETECTF that is complementary to the DETECT signal. In this arrangement, the D flip-flop 302 toggles between HIGH and LOW logic levels as clocked by the DETECTF signal. The output of the D flip-flop 302 is used to provide a Detect00 signal that sets the detection logic 300 to detect a 00 count. The input of the D flip-flop 302, which is forced to the complementary logic level of the output by the inverter 304, is used to provide a Detect11 signal that sets the detection logic 300 to detect a 11 count.

The detection logic 300 further includes a first three-input NAND gate 306 receiving first and second bits Q<0>, Q<1> of a two-bit Gray code and the Detect11 signal. A second three-input NAND gate 308 receives complementary first and second bits QF<0>, QF<1> and the detect 00 signal. The output of the first and second NAND gates 306, 308 are logically combined by a NAND gate 310. Generally, the NAND gates 306, 308 are used to generate active output signals when the respective count value is reached. The output signals of the NAND gates 306, 308 are typically at HIGH logic levels except when the respective count value is reached and the respective detect signal is active, at which time the output signal switches to a LOW logic level. As a result, the output of the NAND gate 310 is typically LOW until one of the NAND gates 306, 308 detects the respective count value and that count value is currently set for detection.

The output signal of the NAND gate 310 is provided to an inverter 311 and a NAND gate 314. The output of the inverter 311 is coupled to a second input of the NAND gate 314 through delay circuits 312. The inverter 311, delay circuits 312, and NAND gate 314 form a pulse circuit that generates an inactive HIGH output signal in response to a LOW output from the NAND gate 310 and an active LOW pulse in response to the output of the NAND gate 310 switching from a LOW level to a HIGH level. The delays 312 set the pulse width of the LOW pulse. As previously discussed, the output of the NAND gate 310 switches from LOW to HIGH when the count value (either 00 or 11) that is set is reached by the two-bit Gray code counter. As previously described, the DETECTF signal output by the NAND gate 314 is used to clock the DQ flip-flop 302. As a result, when the DETECTF signal is pulsed LOW, the logic levels of the Detect00 and Detect11 signals are switched to set the detection logic 300 from detecting one count value to the other. As explained with reference to FIG. 4, switching the Gray code count value to be detected by the detection logic 208 avoids the need for the counter 204 (FIG. 3) to be reset when the desired count value is reached.

Figure 6:
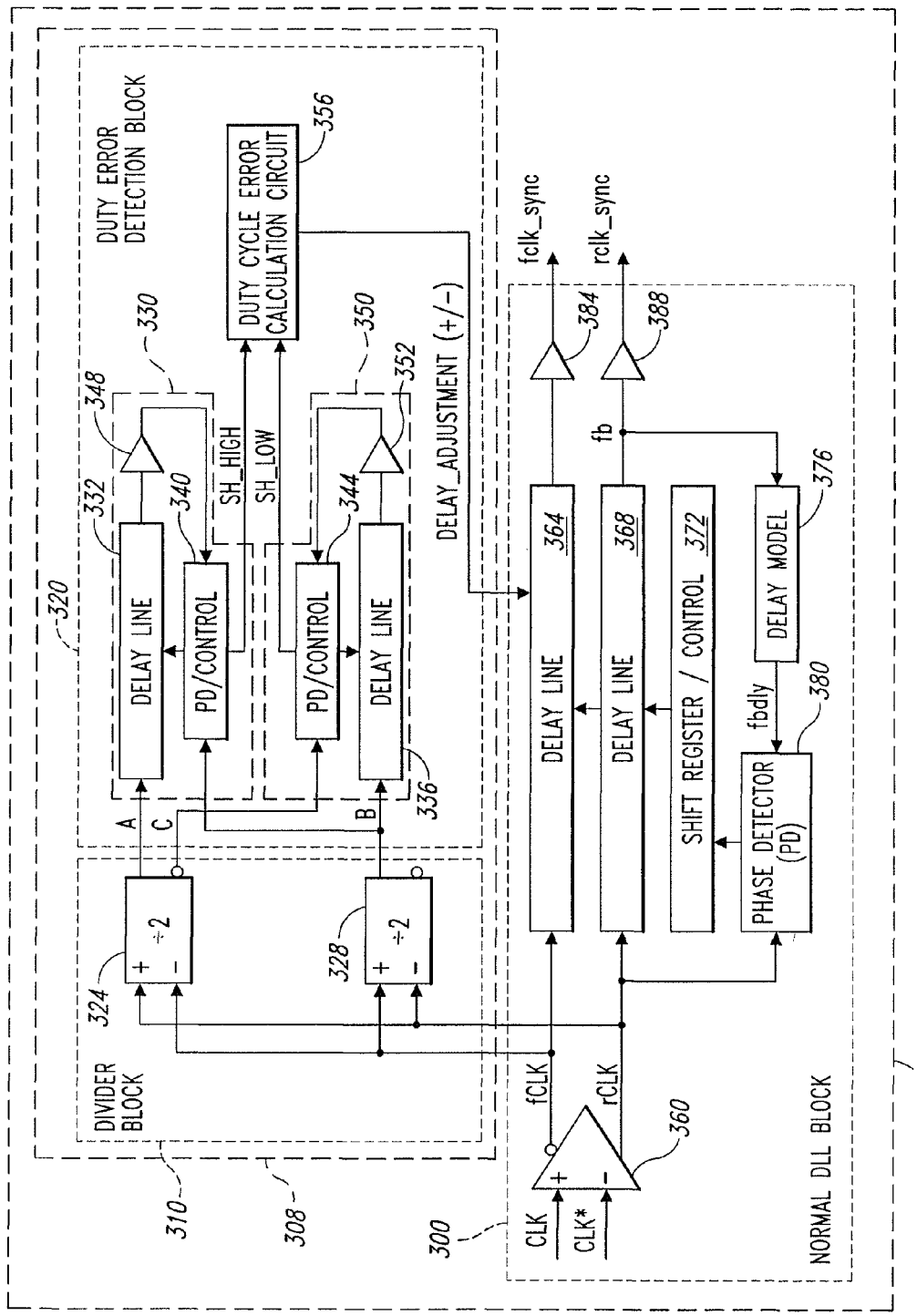
FIG. 6 is a block diagram of a combined delay-locked loop/duty cycle correction (DLL/DCC) circuit in which an event filter according to an embodiment of the present invention can be utilized.
Figure 7:
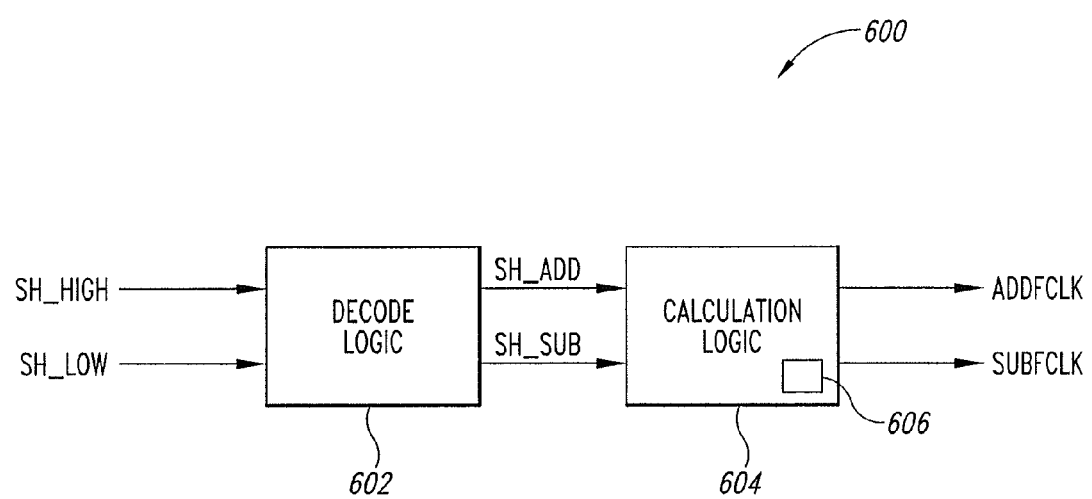
FIG. 7 is a block diagram of the calculation logic of the DLL/DCC circuit of FIG. 6 including an event filter according to an embodiment of the present invention.

FIG. 6 illustrates a combined delay-locked loop and duty cycle correction (DLL/DCC) circuit 400 in which an event filter according to an embodiment of the present invention can be utilized. In summary, the DLL/DCC 400 generates complementary clock signals fclk_sync, rclk_sync that are synchronized to an input clock signal CLK. When corrected to a 50% duty cycle, the rising edges of the fclk_sync, rclk_sync signals occur at the same times as clock edges of a clock signal having a 50% duty cycle. Duty cycle correction is performed by measuring the times of the high- and low- cycles of the CLK signal and averaging that difference to provide a delay adjustment signals that are used to adjust a phase relationship between the fclk_sync, rclk_sync signals. The phase of the two clock signals is adjusted by either delay line 364, 368 of the DLL circuit. As shown in FIG. 6, the delay line 364 is adjusted by the delay adjustment signals.

The times of the high- and low cycles of the CLK signal are measured by measurement circuits 330 and 350, respectively, which generate SH_HIGH and SH_LOW signals that are indicative of the of the measurement. The SH_HIGH, SH_LOW signals are typically pulsed signals with the number of pulses representing the time of the high- and low-cycles. As a result, the difference in the number of pulses of the SH_and SH_LOW signals represents the time difference between the high- and low-cycles of the CLK signal. A duty cycle error calculation circuit 356 averages the difference to calculate the appropriate delay adjustment signal and adjust the delay line 364. A more detailed description of a DLL/DCC circuit can be found in co-pending U.S. patent application Ser. No. 11/250,600 to Kwak, filed on Oct. 14, 2005, entitled CLOCK GENERATOR HAVING A DELAY LOCKED LOOP AND DUTY CYCLE CORRECTION CIRCUIT IN A PARALLEL CONFIGURATION, which is incorporated herein by reference.

FIG. 6 illustrates a functional block diagram of the duty cycle error calculation circuit 356. Decode logic 602 and calculation logic 604 are included in the duty cycle error calculation circuit 356 to generate ADDFCLK, SUBFCLK signals which are provided as delay adjustment signals. In summary, the decode logic 602 receives the SH_HIGH, SH_LOW signals from the measurement circuits 330, 350, and based on the combination of the SH_HIGH, SH_LOW signals, generates event signals SH_ADD, SH_SUB. Generally, the SH_ADD, SH_SUB signals are pulses that indicate whether delay should be added or removed to adjust the phase relationship between the fclk_sync, rclk_sync signals and provide a 50% duty cycle.

The calculation logic 604 uses the SH_ADD, SH_SUB signals from the decode logic 602 to calculate whether delay adjustment should be made, and if so, how much of an adjustment should be made. As previously discussed, the calculation logic 604 adjusts the delay 364 by an average of the difference between the high- and low-cycles of the CLK signal. The calculation logic 604 performs the calculation by tracking the number of SH_ADD, SH_SUB pulses and generating one ADDFCLK pulse to add delay in response to two consecutive SH_ADD pulses and generating one SUBFCLK pulse to decrease delay in response to two consecutive SH_SUB pulses. An event filter 606 in accordance to an embodiment of the present invention is included in the calculation logic 604 and is used to track the number of SH_ADD, SH_SUB pulses (i.e., events). As previously described with respect to event filter 200 (FIG. 3), the event filter 606 includes a Gray code counter and detection logic to track the number of SH_ADD, SH_SUB pulses and generate an active DETECT signal in response to detecting the currently set count value. Upon detecting the set count value and generating an active DETECT signal, the detection logic is set to detect another count value. Thus, unlike conventional event filters that include binary counting circuits or shift registers, upon detecting the set count value, the Gray code counter is not reset to an initial value. Instead, the detection logic is switched to detect another count value. As illustrated by the present example, and event filter according to an embodiment of the present invention can be used in calculation logic for averaging a number of events.

Figure 8:
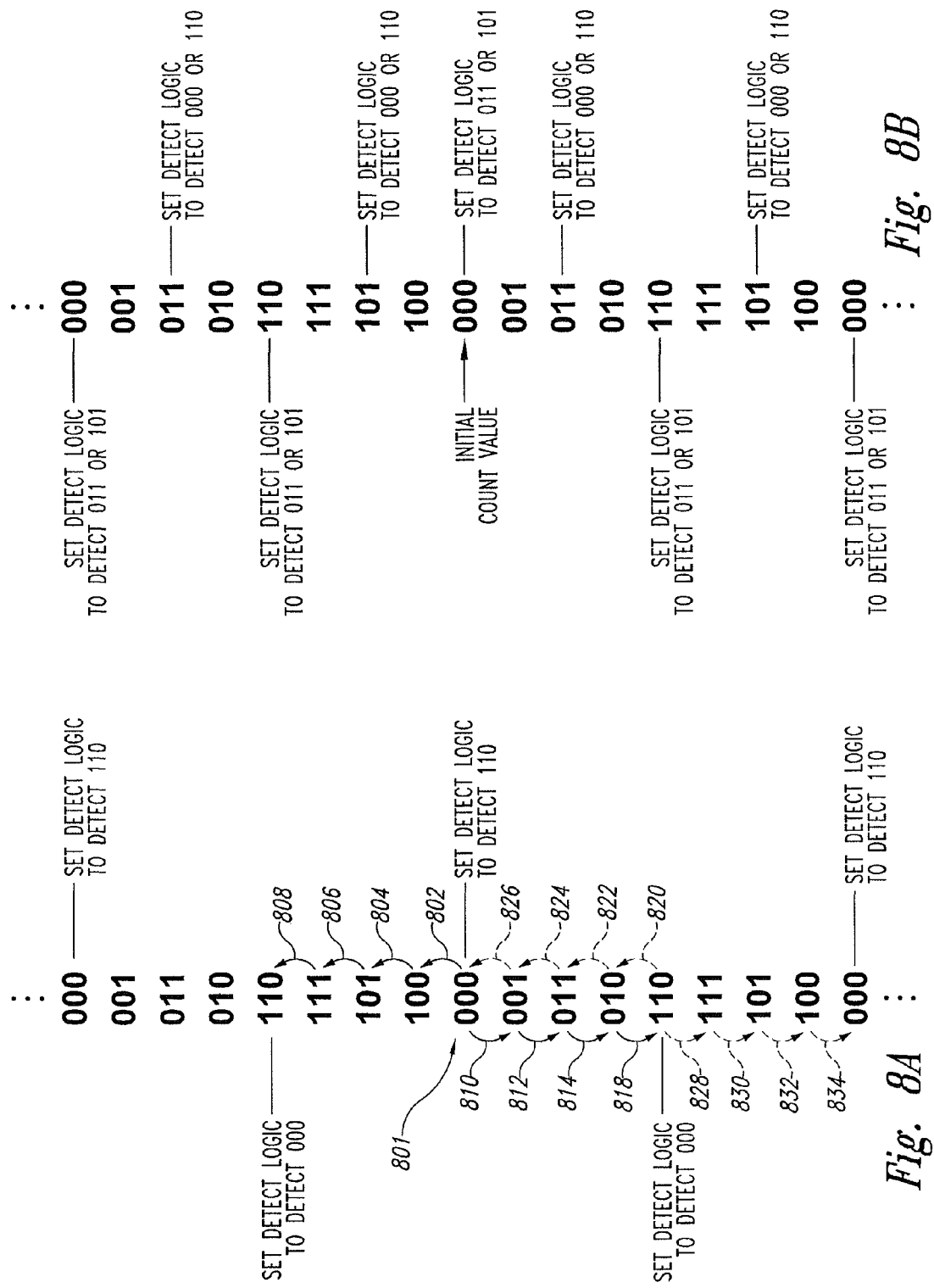
FIGS. 8A and 8B are diagrams illustrating operation of event filters according to alternative embodiments of the present invention.

The event filter 200 (FIG. 3) previously described is an embodiment of the present invention having a two-bit Gray code counter. FIGS. 8A and 8B illustrate operation of alternative embodiments of event filters having three-bit Gray code counters. In FIG. 8A, detection logic coupled to the output of the three-bit Gray code counter is configured to detect two different count values. As a result, an active DETECT signal is output by the detection logic once for every four incrementing events or four decrementing events. For example, assuming the count of the Gray code counter is 000 (at count 801), the detection logic is set to detect a count value of 110, which is four counts in either direction from 000. For example, incrementing four counts, represented in FIG. 8A by arrows 802, 804, 806, 808, to 110 causes the detection logic to output an active DETECT signal and sets the detection logic to detect a 000 count. Similarly, decrementing four counts, represented in FIG. 8A by arrows 810, 812, 814, 818, results in a count of 110, which causes the detection logic to output an active DETECT signal and sets the detection logic to then detect a 000 count. As demonstrated, from a 000 count, incrementing or decrementing four counts results in the generation of an active DETECT signal. From a count of 110, and with the detection logic set to detect a 000 count, four counts in either direction will again cause the detection logic to generate an active DETECT signal. This is illustrated in FIG. 8A by arrows 828, 830, 832, 834 (decrementing the count from 110) and by arrows 820, 822, 824, 826 (incrementing the count from 110). As previously discussed, after the set count value is detected by the detection logic, the Gray code counter continues to count so that no events are missed. The detection logic should be switched to detect the new count value within a time equal to the number of events that are to be counted before an active DETECT signal is to be generated.

FIG. 8B illustrates operation of an event counter according to another embodiment of the present invention having a three-bit Gray counter. In contrast to the embodiment described with reference to FIG. 8A, the embodiment described with reference to FIG. 8B detects four different count values, thereby using a three-bit Gray code for generating an active DETECT signal in response to two events. As shown in FIG. 8B, the four different count values are paired into two sets of two count values. Each count value in a pair can be alternatively detected. For example, a first pair of count values includes 011 and 101 count values. When the current count value is 000, detection logic is set to detect the count values of 011 or 101. Similarly, when the current count value is 110, the detection logic is again set to detect 011 or 101 count values. When these count values are set for detection and the current count value is either 000 or 110, incrementing or decrementing the three-bit Gray code count by two counts will cause an active DETECT signal to be generated. A second pair of count values for detection includes 000 and 110 count values. When these count values are set for detection and the current count value is either 101 or 011, incrementing or decrementing the three-bit Gray code count by two counts will cause an active DETECT signal to be generated.

As illustrated by the examples described with reference to FIGS. 8A and 8B, an event filter having an N-bit Gray code counter is not limited to generating an active DETECT signal for only 2^(N−1) counts.

Figure 9:
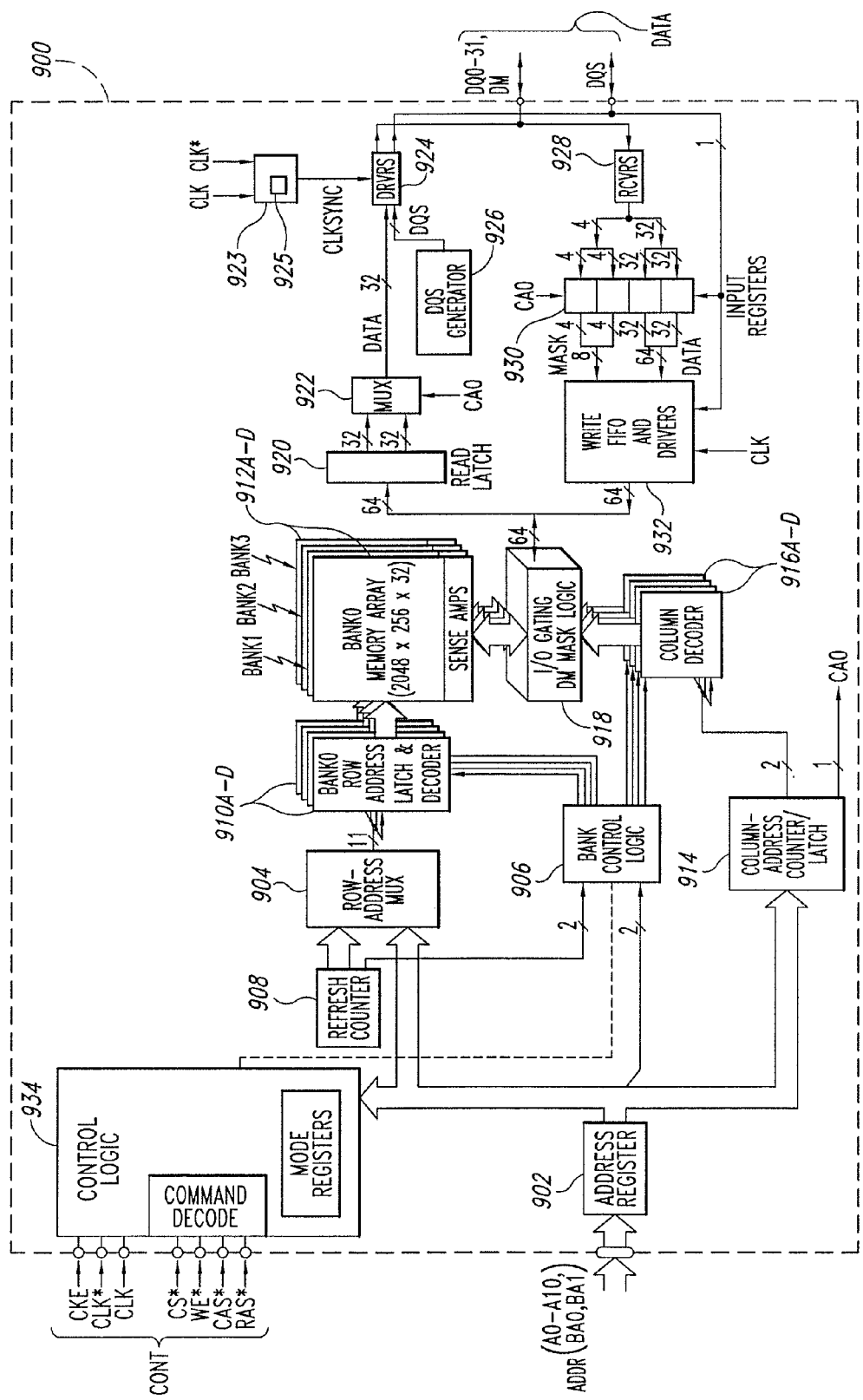
FIG. 9 is a functional block diagram illustrating a synchronous memory device including a clock generator having an event filter according to an embodiment of the invention.

FIG. 9 is a functional block diagram of a memory device 900 including a clock generator 923 having an event filter 925 according to an embodiment of the present invention. The memory device 900 in FIG. 9 is a double-data rate ("DDR") SDRAM, although the principles described herein are applicable to any memory device that may include a delay-locked loop for synchronizing internal and external signals, such as conventional SDRAMs, as well as packetized memory devices like SLDRAMs and RDRAMs, and are equally applicable to any integrated circuit that must synchronize internal and external clocking signals.

The memory device 900 includes an address register 902 that receives row, column, and bank addresses over an address bus ADDR, with a memory controller (not shown) typically supplying the addresses. The address register 902 receives a row address and a bank address that are applied to a row address multiplexer 904 and bank control logic circuit 906, respectively. The row address multiplexer 904 applies either the row address received from the address register 902 or a refresh row address from a refresh counter 908 to a plurality of row address latch and decoders 910A-D. The bank control logic 906 activates the row address latch and decoder 910A-D corresponding to either the bank address received from the address register 902 or a refresh bank address from the refresh counter 908, and the activated row address latch and decoder latches and decodes the received row address. In response to the decoded row address, the activated row address latch and decoder 910A-D applies various signals to a corresponding memory bank 912A-D to thereby activate a row of memory cells corresponding to the decoded row address. Each memory bank 912A-D includes a memory-cell array having a plurality of memory cells arranged in rows and columns, and the data stored in the memory cells in the activated row is stored in sense amplifiers in the corresponding memory bank. The row address multiplexer 904 applies the refresh row address from the refresh counter 908 to the decoders 910A-D and the bank control logic circuit 906 uses the refresh bank address from the refresh counter when the memory device 900 operates in an auto-refresh or self-refresh mode of operation in response to an auto- or self-refresh command being applied to the memory device 900, as will be appreciated by those skilled in the art.

A column address is applied on the ADDR bus after the row and bank addresses, and the address register 902 applies the column address to a column address counter and latch 914 which, in turn, latches the column address and applies the latched column address to a plurality of column decoders 916A-D. The bank control logic 906 activates the column decoder 916A-D corresponding to the received bank address, and the activated column decoder decodes the applied column address. Depending on the operating mode of the memory device 900, the column address counter and latch 914 either directly applies the latched column address to the decoders 916A-D, or applies a sequence of column addresses to the decoders starting at the column address provided by the address register 902.

In response to the column address from the counter and latch 914, the activated column decoder 916A-D applies decode and control signals to an I/O gating and data masking circuit 918 which, in turn, accesses memory cells corresponding to the decoded column address in the activated row of memory cells in the memory bank 912A-D being accessed.

During data read operations, data being read from the addressed memory cells is coupled through the I/O gating and data masking circuit 918 to a read latch 920. The I/O gating and data masking circuit 918 supplies N bits of data to the read latch 920, which then applies two N/2 bit words to a multiplexer 922. The circuit 918 provides 64 bits to the read latch 920 which, in turn, provides two 32 bits words to the multiplexer 922. A data driver 924 sequentially receives the N/2 bit words from the multiplexer 922 and also receives a data strobe signal DQS from a strobe signal generator 926 and a delayed clock signal CLKSYNC from the clock generator 923. The DQS signal is used by an external circuit such as a memory controller (not shown) in latching data from the memory device 900 during read operations.

In response to the CLKSYNC signal, the data driver 924 sequentially outputs the received N/2 bits words as a corresponding data word DQ, each data word being output in synchronism with rising and falling edges of the CLK and CLK* signals that are applied to clock the memory device 900. The data driver 924 also outputs the data strobe signal DQS having rising and falling edges in synchronism with rising and falling edges of the CLK and CLK* signals, respectively. Each data word DQ and the data strobe signal DQS collectively define a data bus DATA. As will be appreciated by those skilled in the art, the CLKSYNC signal from the DLL is a delayed version of the complementary CLK and CLK* signals, and the clock generator 923 adjusts the delay of the CLKSYNC signal relative to the CLK and CLK* signals to ensure that the DQS signal and the DQ words are placed on the DATA bus in synchronism with the CLK and CLK* signals, as previously described. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM on the data bus DATA. A data receiver 928 receives each DQ word and the associated DM signals, and applies these signals to input registers 930 that are clocked by the DQS signal. In response to a rising edge of the DQS signal, the input registers 930 latch a first N/2 bit DQ word and the associated DM signals, and in response to a falling edge of the DQS signal the input registers latch the second N/2 bit DQ word and associated DM signals. The input register 930 provides the two latched N/2 bit DQ words as an N-bit word to a write FIFO and driver 932, which clocks the applied DQ word and DM signals into the write FIFO and driver in response to the DQS signal. The DQ word is clocked out of the write FIFO and driver 932 in response to the CLK signal, and is applied to the I/O gating and masking circuit 918. The I/O gating and masking circuit 918 transfers the DQ word to the addressed memory cells in the accessed bank 912A-D subject to the DM signals, which may be used to selectively mask bits or groups of bits in the DQ words (i.e., in the write data) being written to the addressed memory cells.

A control logic and command decoder 934 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 934 latches and decodes an applied command, and generates a sequence of clocking and control signals that control the components 902-932 to execute the function of the applied command. The clock enable signal CKE enables clocking of the command decoder 934 by the clock signals CLK, CLK*. The command decoder 934 latches command and address signals at edges of the CLK, CLK* signals (i.e., the crossing point of CLK going high and CLK* going low), while the input registers 930 and data drivers 924 transfer data into and from, respectively, the memory device 900 in response to both edges of the data strobe signal DQS and thus at double the frequency of the clock signals CLK, CLK*. This is true because the DQS signal has the same frequency as the CLK, CLK* signals. The memory device 900 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 934 in generating the control and timing signals is conventional, and thus, for the sake of brevity, will not be described in more detail.

Figure 10:
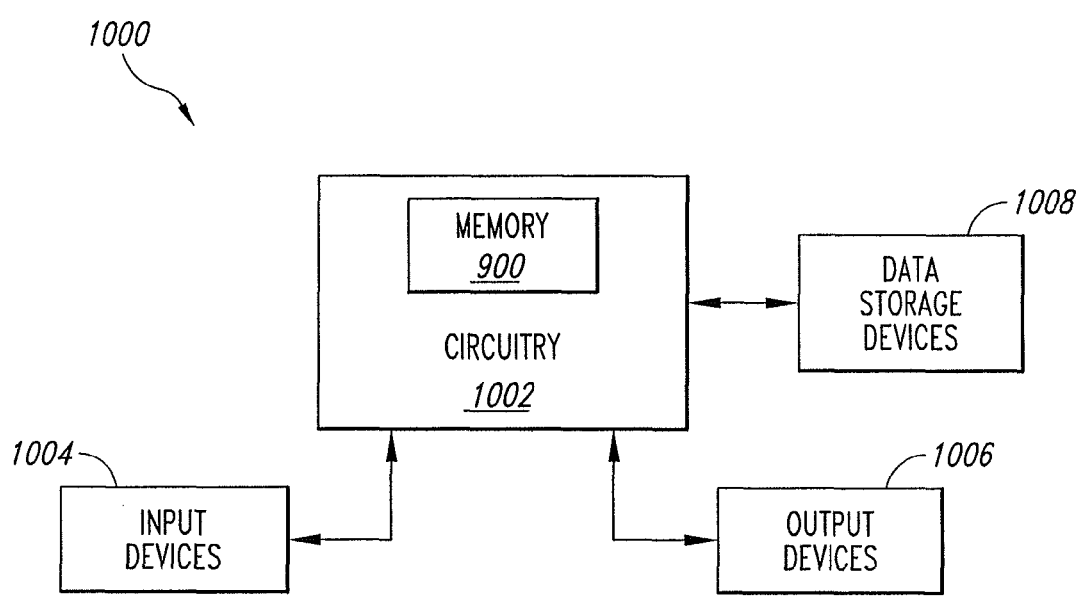
FIG. 10 is a functional block diagram illustrating a processor-based system including the synchronous memory device of FIG. 9.

FIG. 10 is a block diagram of a processor-based system 1000 including processor circuitry 1002, which includes the memory device 900 of FIG. 10. Typically, the processor circuitry 1002 is coupled through address, data, and control buses to the memory device 900 to provide for writing data to and reading data from the memory device. The processor circuitry 1002 includes circuitry for performing various processing functions, such as executing specific software to perform specific calculations or tasks. In addition, the processor-based system 1000 includes one or more input devices 1004, such as a keyboard or a mouse, coupled to the processor circuitry 1002 to allow an operator to interface with the processor-based system 1000. Typically, the processor-based system 1000 also includes one or more output devices 1006 coupled to the processor circuitry 1002, such as output devices typically including a printer and a video terminal. One or more data storage devices 1008 are also typically coupled to the processor circuitry 1002 to store data or retrieve data from external storage media (not shown). Examples of typical storage devices 1008 include hard and floppy disks, tape cassettes, compact disk read-only ("CD-ROMs") and compact disk read-write ("CD-RW") memories, and digital video disks ("DVDs").

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A filter comprising:
   a counter configured to increment and decrement through a sequence of internally generated states responsive to a clock signal and in accordance with a state of phase signals provided to the counter; and
   detection logic coupled to the counter, wherein the detection logic is configured to detect a predetermined state of the counter and provide a detect signal responsive to detection of the predetermined state, wherein the detection logic is further configured to receive the detect signal and switch the predetermined state responsive to receipt of the detect signal, wherein the detection logic is configured to detect a first predetermined state of the counter and switch to detect a second predetermined state responsive to receipt of the detect signal, and further configured to switch to detect the first predetermined state of the counter responsive to detecting the second predetermined state, and wherein the first predetermined state and the second predetermined state are separated by two consecutive states.

2. The filter of claim 1, wherein the detection logic comprises a flip-flop configured to receive the detect signal at a clock input and receive an output of the flip-flop as an input.

3. The filter of claim 1 wherein the counter is configured to increment responsive to a first one of the phase signals and decrement responsive to a second one of the phase signals.

4. The filter of claim 3, further comprising shift logic configured to provide control signals to a delay controller based at least in part on the detect signal and the first and second ones of the phase signals.

5. A filter, comprising:
a counter configured to increment and decrement through a sequence based at least in part on a clock signal and phase signals; and
detection logic coupled to the counter and configured to detect a first count value of the sequence, and in response to detecting the first count value, configured to switch detection to a second count value of the sequence, the detection logic comprises a flip-flop configured to receive a detect signal as a clock and further configured to generate detect enable outputs, with a detect enable output comprising the input to the flip-flop, and wherein the detect enable outputs are combined with count values of the counter at a combination of logic gates to generate the detect signal.

6. The filter of claim 5 wherein the counter comprises a Gray code counter.

7. The filter of claim 5 wherein the counter is configured to increment and decrement through the sequence between the first and second count values of the sequence without resetting the count.

8. The filter of claim 5 wherein the counter comprises an up/down counter.

9. The filter of claim 5 wherein the sequence of the counter is not an arithmetic code.

10. A method for generating an active output signal in response to detecting N events, the method comprising:
incrementing and decrementing, by a counter circuit, through a sequence of count values in response to the occurrence of events;
generating, by a detection circuit configured to detect a first predetermined count value, an active output signal in response to detecting the first count value of the sequence;
switching, by the detection circuit, from detecting the first count value to detecting a second predetermined count value of the sequence in response to detecting the first predetermined count value; and
continuing, by the counter circuit, to increment and decrement through the sequence in response to the occurrence of the events,
wherein the first count value and the second count value are separated by at least two consecutive count values of the sequence of count values.

11. The method of claim 10 wherein incrementing and decrementing through a sequence of count values comprises incrementing and decrementing through a Gray code sequence.

12. The method of claim 10 wherein incrementing and decrementing through a sequence of count values in response to the occurrence of events comprises:
incrementing the sequence of count values in response to a clock signal and a first direction signal; and
decrementing the sequence of count values in response to the clock signal and a second direction signal.

13. The method of claim 10 wherein incrementing and decrementing through a sequence of count values comprises incrementing and decrementing through a sequence of 2N count values.

14. The method of claim 10, further comprising:
generating an active output signal in response to detecting the second count value of the sequence; and
switching from detecting the second count value to detecting the first count value of the sequence.

15. A method of tracking occurrence of events, comprising:
incrementing and decrementing, by a counter circuit, a count sequence in response to the occurrence of events;
generating, by a detection logic circuit configured to detect a first predetermined count value, a detect signal in response to detecting a first count value of the count sequence;
switching, by the detection logic circuit, from detecting the first count value to detecting a second predetermined count value in response to detecting the first predetermined count value;
generating, by the detection logic circuit, the detect signal in response to detecting the second count value, and
detecting third and fourth counts of the count sequence, the first, second, third and fourth count values spaced apart by at least two counts.

16. The method of claim 15 wherein incrementing and decrementing a count sequence comprises incrementing and decrementing a Gray code sequence.

17. The method of claim 15 wherein incrementing and decrementing a count sequence comprises incrementing and decrementing through a count sequence having N counts and the first and second counts are separated by N/2 counts.

18. The method of claim 15 wherein incrementing and decrementing a count sequence comprises incrementing and decrementing through a three-bit count sequence.

* * * * *